(12) United States Patent
Liang et al.

(10) Patent No.: US 10,403,855 B2
(45) Date of Patent: Sep. 3, 2019

(54) DISPLAY SCREEN AND METHOD FOR MANUFACTURING THE SAME, AND DISPLAY DEVICE

(71) Applicant: BOE TECHNOLOGY GROUP CO., LTD., Beijing (CN)

(72) Inventors: Zhiwei Liang, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/145,663

(22) Filed: Sep. 28, 2018

(65) Prior Publication Data
US 2019/0123306 A1    Apr. 25, 2019

(30) Foreign Application Priority Data
Oct. 24, 2017   (CN) .......................... 2017 1 1003188

(51) Int. Cl.
| | |
|---|---|
| *G03B 21/62* | (2014.01) |
| *H01L 51/52* | (2006.01) |
| *H01L 51/56* | (2006.01) |
| *H01L 27/32* | (2006.01) |
| *G02B 3/00* | (2006.01) |

(52) U.S. Cl.
CPC ...... *H01L 51/5275* (2013.01); *H01L 27/3244* (2013.01); *H01L 51/56* (2013.01); *G02B 3/0056* (2013.01)

(58) Field of Classification Search
CPC ................ G02B 3/0056; G02B 3/0068; G02B 27/0961; H01L 27/14625; H01L 27/148; H01L 2924/12044; H01L 33/486; H01L 33/58
See application file for complete search history.

(56) References Cited

U.S. PATENT DOCUMENTS

| | | | |
|---|---|---|---|
| 9,013,790 B1* | 4/2015 | Kazmierski | G03B 21/567 |
| | | | 359/443 |
| 9,838,676 B2* | 12/2017 | Wu | H04N 13/398 |
| 2012/0199859 A1 | 8/2012 | Shikina et al. | |

FOREIGN PATENT DOCUMENTS

| | | |
|---|---|---|
| CN | 102629622 A | 8/2012 |
| CN | 206059444 U | 3/2017 |
| JP | 2013-114772 A | 6/2013 |

OTHER PUBLICATIONS

Notification of the First Office Action issued in Chinese Patent Application No. 201711003188.5, dated Dec. 18, 2018; with English translation.

* cited by examiner

*Primary Examiner* — Jaehwan Oh
(74) *Attorney, Agent, or Firm* — McDermott Will & Emery LLP

(57) ABSTRACT

The present disclosure provides a display screen including a display panel and a backside concave lens array located on a backside of the display panel, wherein the backside is a side of the display panel away from a display side; the display panel comprises a plurality of transparent regions; the backside concave lens array comprises a plurality of backside concave lenses, and each of the plurality of backside concave lenses is corresponding to one of the transparent regions; each of the plurality of backside concave lenses comprises at least one concave surface, and one of the at least one concave surface is disposed away from the display panel.

20 Claims, 10 Drawing Sheets

DISPLAY SCREEN AND METHOD FOR MANUFACTURING THE SAME, AND DISPLAY DEVICE

This application claims priority to Chinese Patent Application No. 201711003188.5, filed on Oct. 24, 2017, titled "DISPLAY SCREEN AND METHOD FOR MANUFACTURING THE SAME, AND DISPLAY DEVICE", which is incorporated herein by reference in its entirety.

TECHNICAL FIELD

The present application relates to the technical field of display, more particularly, to a display screen and a method for manufacturing the same, and a display device.

BACKGROUND

At present, in order to facilitate people's life, some display devices are manufactured to have a transparent state when displaying (i.e., a transparent display state), so that viewers can see the scene behind the display device. More commonly, this kind of display device can be used in places where physical objects behind the display device need to be displayed, such as show windows, refrigerator doors, etc.

Organic Light Emitting Diode (OLED) devices have attracted wide attention, owing to the advantages of self-luminescence, rich colour, fast response, wide viewing angle, light weight, thin thickness, low power consumption and being realized as a flexible display. Researchers aspire to apply OLED components to display devices that can be manufactured to have a transparent display state, so as to develop an OLED display device that can not only display but also can have a transparent state.

SUMMARY

One aspect of embodiments of the present disclosure provides a display screen. The display screen includes a display panel and a backside concave lens array located on a backside of the display panel, wherein the backside is a side of the display panel away from a display side; the display panel comprises a plurality of transparent regions; the backside concave lens array comprises a plurality of backside concave lenses, and each of the plurality of backside concave lenses is corresponding to a corresponding one of the plurality of transparent regions; each of the plurality of backside concave lenses comprises at least one concave surface, and one of the at least one concave surface is disposed away from the display panel.

In some embodiments of the present disclosure, the display panel further comprises a plurality of pixel display regions; the plurality of pixel display regions and the plurality of transparent regions are both arranged in an array, the plurality of pixel display regions and the plurality of transparent regions are arranged alternatively; each of the plurality of backside concave lenses is in one-to-one correspondence with each of the plurality of transparent regions.

In some embodiments of the present disclosure, an area covered by each of the plurality of backside concave lenses is greater than or equal to an area of a corresponding one of the plurality of transparent regions.

In some embodiments of the present disclosure, each of the plurality of backside concave lenses is a double-sided concave lens; or each of the plurality of backside concave lenses is a plano-concave lens, and a concave surface of the plano-concave lens is disposed away from the display panel relative to a flat surface of the plano-concave lens.

In some embodiments of the present disclosure, each of the plurality of backside concave lenses is made of epoxy resin, polymethyl methacrylate or polydimethylsiloxane.

In some embodiments of the present disclosure, the display screen further comprises a transparent backside substrate film disposed on the backside of the display panel, and the backside concave lens array is formed on the transparent backside substrate film.

In some embodiments of the present disclosure, the display screen further comprises: a display side concave lens array located on a display side of the display panel, wherein the display side concave lens array comprises a plurality of display side concave lenses, each of the plurality of display side concave lenses is in one-to-one correspondence with each of the plurality of transparent regions, each of the plurality of display side concave lenses comprises at least one concave surface, and one of the at least one concave surface is disposed away from the display panel.

In some embodiments of the present disclosure, a coverage area of each of the plurality of display side concave lenses is greater than or equal to an area of a corresponding one of the plurality of transparent regions.

In some embodiments of the present disclosure, each of the plurality of display side concave lenses is a double-sided concave lens; or each of the plurality of display side concave lenses is a plano-concave lens, and a concave surface of the plano-concave lens is disposed away from the display panel relative to a flat surface of the plano-concave lens.

In some embodiments of the present disclosure, each of the plurality of display side concave lenses is made of epoxy resin, polymethyl methacrylate or polydimethylsiloxane.

In some embodiments of the present disclosure, the display screen further comprises a transparent display side substrate film disposed on the display side of the display panel, and the display side concave lens array is formed on the transparent display side substrate film.

In some embodiments of the present disclosure, a radius of curvature of a concave surface of each of the plurality of backside concave lenses is greater than or equal to a radius of curvature of a concave surface of each of the plurality of display side concave lenses.

In some embodiments of the present disclosure, the display panel is an OLED panel comprising: a base substrate; a plurality of OLED devices disposed on the base substrate; a plurality of transparent filling sections disposed on the base substrate; wherein each of the plurality of pixel display regions is provided with at least one of the plurality of OLED devices; a region of the base substrate corresponding to each of the plurality of transparent regions is provided with one of the plurality of transparent filling sections.

In some embodiments of the present disclosure, each of the plurality of transparent filling sections is made of transparent resin.

In some embodiments of the present disclosure, the display screen further comprises: a plano-convex lens array disposed on a display side of the display panel; at least one sub-pixel disposed in each of the plurality of pixel display regions; wherein the plano-convex lens array comprises a plurality of plano-convex lenses, each of plurality of plano-convex lenses is disposed opposite to the at least one sub-pixel in a corresponding one of the plurality of pixel display regions, and a convex surface of each of the plurality of plano-convex lenses is disposed away from the display panel relative to a flat surface of each of the plurality of plano-convex lenses.

In some embodiments of the present disclosure, each of the plurality of plano-convex lenses is disposed opposite to each of the at least one sub-pixel in a corresponding pixel display region.

Another aspect of embodiments in the present disclosure provides a display device comprising a display screen described above.

Still another aspect of embodiments in the present disclosure provides a method for manufacturing a display screen described above, comprising: forming a display panel comprising a plurality of transparent regions; forming a backside concave lens array on a backside of the display panel, wherein the backside concave lens array comprises a plurality of backside concave lenses, each of the plurality of backside concave lenses is corresponding to one of the plurality of transparent regions, each of the plurality of backside concave lenses comprises at least one concave surface, and one of the at least one concave surface is disposed away from the display panel.

In some embodiments of the present disclosure, the display panel further comprises a plurality of pixel display regions; the plurality of pixel display regions and the plurality of transparent regions are both arranged in an array, the plurality of pixel display regions and the plurality of transparent regions are arranged alternatively, and each of the plurality of pixel display regions is provided with at least one sub-pixel; the method for manufacturing a display screen further comprises: forming a display side concave lens array and a plano-convex lens array on a display side of the display panel, wherein the display side concave lens array comprises a plurality of display side concave lenses, each of the plurality of display side concave lenses is in one-to-one correspondence with each of the plurality of transparent regions, each of the plurality of display side concave lenses comprises at least one concave surface, and one of the at least one concave surface is disposed away from the display panel; the plano-convex lens array comprises a plurality of plano-convex lenses, each of the plurality of plano-convex lenses is disposed opposite to the at least one sub-pixel in a corresponding one of the plurality of pixel display regions, and a convex surface of each of the plurality of plano-convex lenses is disposed away from the display panel relative to a flat surface of each of the plurality of plano-convex lenses.

In some embodiments of the present disclosure, forming a backside concave lens array on a backside of the display panel comprises: forming a transparent backside substrate film; forming a backside concave lens array on the transparent backside substrate film using a photoetching or imprint technique, wherein the photoetching technique is a laser direct writing technique, and the imprint technique is a nanometer imprint technique. Forming a display side concave lens array and a plano-convex lens array on a display side of the display panel comprises: forming a transparent display side substrate film; forming a display side concave lens array and a plano-convex lens array on the transparent display side substrate film using a photoetching or imprint technique, wherein the photoetching technique is a laser direct writing technique, and the imprint technique is a nanometer imprint technique.

BRIEF DESCRIPTION OF THE DRAWINGS

To make objectives, technical solutions and advantages in embodiments of the present disclosure clearer, the technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

DETAILED DESCRIPTION

In the related art, a display device includes a display screen having a plurality of pixel regions arranged in an array, each pixel region comprising a light-emitting display region and a transparent region. The display screen comprises at least one OLED component located in the light-emitting display region, and light emitted by the OLED component is emitted through a display side of the display screen to implement a display function of the display screen. The light reflected by an object located at the back the display screen (that is, a side of the display screen away from the display side) passes through the transparent region and then exits through the display side of the display screen, thus implementing a transparent function of the display screen that viewers at the display side can see the object located behind the display screen. On this basis, a transparent display state of the display device can be realized.

However, for a display screen provided in the related art, since it has structural design problems, the light reflected or emitted by the object behind the display screen has a low transmittance when it passes through the display screen, resulting in a poor transparent display effect of the display device.

In order to further explain the display screen and the manufacturing method thereof and the display device provided in some embodiments of the present disclosure, the following is described in detail with reference to the accompanying drawings.

Figure 1:
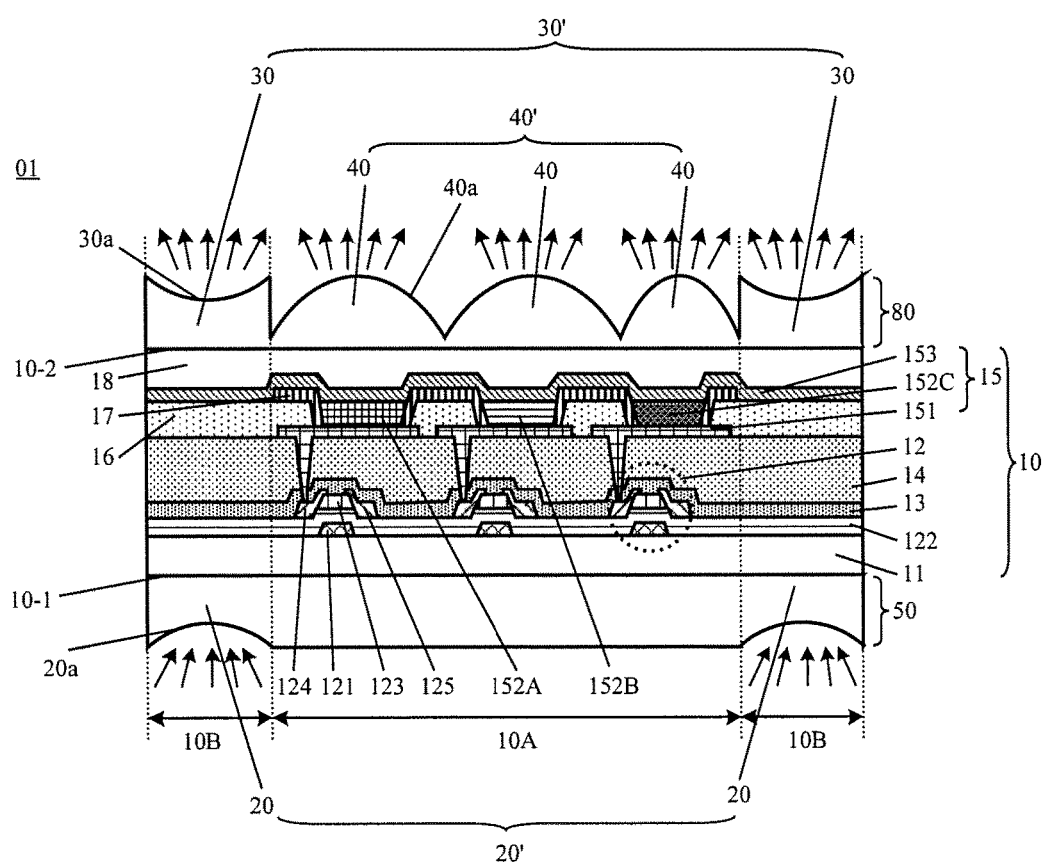
FIG. 1 is a schematic structural diagram of a display screen provided in some embodiments of the present disclosure.
Figure 2:
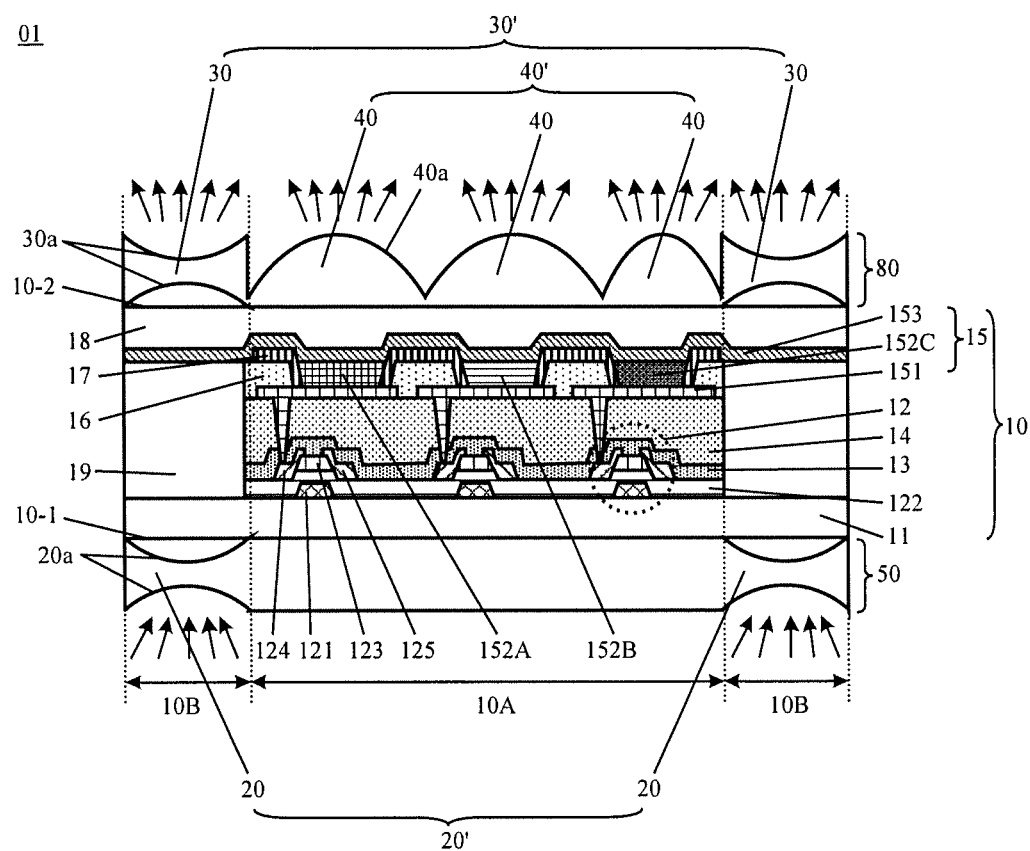
FIG. 2 a schematic structural diagram of another display screen provided in some embodiments of the present disclosure.

Referring to FIG. 1 or 2, the display screen 01 provided in some embodiments of the present disclosure includes a display panel 10, a backside 10-1 of the display panel 10 being a side of the display panel 10 away from a display side 10-2; the display panel 10 includes a plurality of transparent regions 10B. The display screen 01 further comprises a backside concave lens array 20' located on the backside 10-1 of the display panel 10. The backside concave lens array 20' comprises a plurality of backside concave lenses 20, each of the plurality of backside concave lenses 20 is corresponding to a corresponding one of the plurality of transparent regions 10B, each of the plurality of backside concave lenses 20 comprises at least one concave surface 20a, and one of the at least one concave surface 20a is disposed away from the display panel 10.

Taking the concave surface 20a of the backside concave lens 20 being a spherical surface as an example, one of the at least one concave surface 20a being disposed away from the display panel 10 is that, a centre of sphere corresponding to one of the at least one concave surface 20a is located on a side of the backside concave lens 20 away from the display panel 10.

The following description is still made for the example that the concave surface 20a of the backside concave lens 20 is realized as a spherical surface. Concave lens is also called as a negative sphere lens, which has a thin centre and thick edges, and takes a concave shape. Concave lens has a divergent effect on light, and parallel light will be transformed to divergent light through the concave lens. The light (as shown by the arrow in FIG. 1 or FIG. 2) reflected or emitted by the object at the back of the display screen 01 (i.e., the backside 10-1) is directed to a corresponding transparent region 10B after passing through the backside concave lens 20. Thus, by means of the backside concave lens 20 in the backside concave lens array 20', the intensity of the light can be increased, thereby improving the light transmission effect of the transparent region 10B.

When the light reflected or emitted by the object behind the display screen 01 passes through the transparent region 10B by the aid of the backside concave lens 20 and then exits through the display side 10-2 of the display panel 10, viewers in front of the display screen 01 (i.e. the display side 10-2) can see the object or scene behind the display screen 01 through the transparent region 10B. Since the backside 10-1 of the display panel 10 is provided with a backside concave lens array 20', which directs the light reflected or emitted by the object behind the display screen 01 to the corresponding transparent region 10B, the amount of light reflected or emitted by the object behind the display screen 01 that passes through the transparent region 10B can be increased. On this basis, the transparent display effect of the display screen 01 can be improved by increasing the transmittance amount of the light reflected or emitted by the object behind the display screen 01 when it passes through the display screen 01.

Still referring to FIG. 1 or 2, the display panel 10 further comprises a plurality of pixel display regions 10A; the plurality of pixel display regions 10A and the plurality of transparent regions 10B are both arranged in an array, each of the plurality of pixel display regions 10A and each of the plurality of transparent regions 10B are arranged alternatively; each of the plurality of backside concave lenses 20 is in one-to-one correspondence with each of the plurality of transparent regions 10B.

Illustratively, the display panel 10 provided in some embodiments of the present disclosure has a display side 10-2 and a backside 10-1 opposite to the display side 10-2; a lower side of the display panel 10 illustrated in FIG. 1 or 2 is the back side 10-1 of the display panel 10, and an upper side of the display panel 10 illustrated in FIG. 1 or 2 is the display side 10-2 of the display panel 10. The backside 10-1 of the display panel 10 serves as a rear of the display screen 01 and the display side 10-2 of the display panel 10 serves as a front of the display screen 01.

The display panel 10 comprises a plurality of pixel display regions 10A and a plurality of transparent regions 10B; the plurality of pixel display regions 10A and the plurality of transparent regions 10B are both arranged in an array, each of the plurality of pixel display regions 10A and each of the plurality of transparent regions 10B are arranged alternatively.

The plurality of pixel display regions 10A and the plurality of transparent regions 10B may be arranged alternately in various ways. For example, there is at least one pixel display region 10A between two adjacent transparent regions 10B, and when the pixel display region 10A displays a picture, the pixel display area 10A enables the light for displaying the picture to be emitted through the display side 10-2 of the display panel 10 to cause the display panel 10 to display the picture, thus implementing a display function of the display screen 01, i.e., implementing a display function of a display device including the display screen 01.

The transparent region 10B is in a transparent state. The light reflected or emitted by the object located at the back of the display screen 01 (i.e. below the display screen 01 shown in FIG. 1 or 2) passes through the transparent region 10B, and then exits through the display side 10-2 of the display panel 10, so that viewers located in front of the display screen 01 can see the object or scene located behind the display screen 01 through the transparent region 10B, thus implementing a transparent function of the display screen 01, i.e., implementing a transparent function of a display device including the display screen 01.

Illustratively, the display panel 10 provided in some embodiments of the present disclosure is an OLED display panel.

Still referring to FIG. 1 or 2, in the display screen 01 provided in some embodiments of the present disclosure, the backside concave lens array 20' is located on a backside of the transparent region 10B, and the transparent region 10B can be considered as a transparent display surface of the display panel 10.

A lower side of the display panel 10 illustrated in FIG. 1 or 2 is the backside 10-1 of the display panel 10, and an upper side of the display panel 10 in FIG. 1 or 2 is the display side 10-2 of the display panel 10. The backside concave lens array 20' is disposed below the display panel 10 in FIG. 1 or 2.

The backside concave lens array 20' comprises a plurality of backside concave lenses 20 arranged in an array, and the plurality of backside concave lenses 20 are in one-to-one correspondence with the plurality of transparent regions 10B. The plurality of backside concave lenses 20 in the backside concave lens array 20' direct the light reflected or emitted by the object located behind the display screen 01 to a corresponding transparent region 10B. The light reflected or emitted by the object behind the display screen 01 passes through the corresponding transparent region 10B via the backside concave lens 20, and then exits through the display side 10-2 of the display panel 10, such that viewers in front of the display screen 01 can see the object or scene behind the display screen 01 through the transparent region 10B. Since the backside 10-1 of the display panel 10 is provided with a backside concave lens array 20', which directs the light reflected or emitted by the object behind the display screen 01 to the corresponding transparent region 10B, the amount of light reflected or emitted by the object behind the display screen 01 that passes through the transparent region 10B can be increased. That is, the transmittance of the light reflected or emitted by the object behind the display screen 01 can be increased when it passes through the display screen 01.

As can be seen from the above description, when the display screen 01 provided in some embodiments of the present disclosure works, the pixel display region 10A in the display panel 10 emits light, and the pixel display region 10A displays to implement the display function of the display screen 01. The light reflected or emitted by the object located behind the display screen 01 is directed to a corresponding transparent region 10B in the display panel 10 through the backside concave lens 20, and exits from the display side 10-2 of the display panel 10 through the transparent region 10B to implement the transparent function of the display screen 01, thus implementing the transparent display function of the display device.

In the display screen 01 provided in some embodiments of the present disclosure, backside concave lenses 20 that are in one-to-one correspondence with the transparent regions 10B are provided on the backside 10-1 of the display panel 10, and they direct the light reflected or emitted by the object behind the display screen 01 to the corresponding transparent regions 10B. Therefore, the backside concave lenses 20 can make the light reflected or emitted by the object located behind the display screen 01 pass through the transparent regions 10B more, and then more light exits through the display side 10-2 of the display panel 10. On this basis, the transparent display effect of the display device comprising the display screen 01 can be improved by increasing the transmittance of the light reflected or emitted by the object behind the display screen 01 when it passes through the display screen 01.

Illustratively, the display screen 01 provided in some embodiments of the present disclosure can be applied to show windows, refrigerator doors, washing machine doors, car windows and other devices. While the display screen 01 displays a picture, the viewers in front of the display screen 01 can see an object or a scene behind the display screen 01 through the display screen 01.

In an exemplary scenario, when the display screen 01 provided in some embodiments of the present disclosure is applied to a refrigerator door, the display screen 01 can display information such as the names of the items stored in the refrigerator or other relevant information, and at the same time enable the user to see the information such as location and quantity of the items inside the refrigerator, through the display screen 01 without opening the refrigerator door.

Still referring to FIG. 1 or 2, in some embodiments of the present disclosure, a coverage area of each of the plurality of backside concave lenses 20 is greater than or equal to an area of a corresponding one of the plurality of transparent regions 10B. Thus the intensity of the light directed to the transparent region 10B by the backside concave lens 20 can be increased.

Here, the coverage area refers to an area of an orthographic projection of the backside concave lens 20 on the display panel 10.

In some embodiments, the backside concave lens 20 can have various structures.

For example, referring to FIG. 1, each of the plurality of backside concave lenses 20 is a plano-concave lens, and under this circumstance, a concave surface 20a of the plano-concave lens is disposed away from the display panel 10 relative to a flat surface of the plano-concave lens. For example, a lower side of the display panel 10 illustrated in FIG. 1 is the backside 10-1 of the display panel 10; under the circumstances that the backside concave lens 20 is a plano-concave lens, the concave surface 20a of the plano-concave lens is located below the flat surface of the plano-concave lens.

Alternatively, referring to FIG. 2, each of the plurality of backside concave lenses 20 is a double-sided concave lens, i.e., one concave surface 20a of the double-sided concave lens is disposed close to the display panel 10, while another concave surface 20a is disposed away from the display panel 10.

In some embodiments, the backside concave lens 20 can be made of various materials.

Illustratively, the material of the backside concave lens 20 is an organic material easy to operate. For example, the material of the backside concave lens 20 may be epoxy resin, polymethyl methacrylate, polydimethylsiloxane, etc. The epoxy resin, polymethyl methacrylate, and polydimethylsiloxane all have the advantages such as optical transparency, low cost and easy duplication. The optical performance of the backside concave lens 20 can be improved and the difficulty in manufacturing the backside concave lens 20 can be reduced by selecting any of epoxy resin, polymethyl methacrylate, polydimethylsiloxane and so on as the material of the backside concave lens 20, so that the backside concave lens 20 can be manufactured using, e.g. a method of nanometer imprinting.

Polydimethylsiloxane is a more choice as the material of the backside concave lens 20. Polydimethylsiloxane is a high molecular organosilicon compound, having the advantages such as low coefficient of optical transparency attenuation, stable chemical structure, good mechanical properties, easy duplication, non-toxicity, biocompatibility and flexibility. The optical performance of the backside concave lens 20 can be further improved and the manufacturing difficulty and manufacturing cost of the backside concave lens 20 can be reduced by selecting polydimethylsiloxane as the material of the backside concave lens 20.

Still referring to FIG. 1 or 2, the display screen 01 provided in some embodiments of the present disclosure further comprises a transparent backside substrate film 50 disposed on the backside of the display panel 10, the backside concave lens array 20' being formed on the transparent backside substrate film 50.

Here, the backside concave lens array being formed on the transparent backside substrate film 50 means forming single-sided or double-sided grooves on a position of the transparent backside substrate film 50 corresponding to the transparent region 10B of the display panel 10, thereby forming the backside concave lenses 20.

The above design enables the plurality of backside concave lenses 20 in the backside concave lens array 20' to be formed on the same transparent backside substrate film 50, which can facilitate the positioning of the backside concave lens 20 and avoid offset between the backside concave lens 20 and the corresponding transparent region 10B.

Still referring to FIG. 1 or 2, the display screen provided in some embodiments in the present disclosure further comprises a display side concave lens array 30' located on a display side 10-2 of the display panel 10. The display side concave lens array 30' includes a plurality of display side concave lenses 30, each of the plurality of display side concave lenses 30 is corresponding in one-to-one correspondence with each of the plurality of transparent regions 10B; each of the plurality of display side concave lenses 30 comprises at least one concave surface 30a, and one of the at least one concave surface 30a is disposed away from the display panel 10.

Taking the concave surface 30a of the display side concave lens 30 being a spherical surface as an example, one of the at least one concave surface 30a being disposed away from the display panel 10 is that, a centre of sphere corresponding to one of the at least one concave surface 30a is located on a side of the display side concave lens 30 away from the display panel 10.

Thus, the light reflected or emitted by the object located behind the display screen 01 exits the display side concave lens 30 after passing through the transparent region 10B of the display panel 10. The display side concave lens 30 can disperse the light transmitted from a corresponding transparent region 10B, and therefore can enlarge an emission angle of the light (as shown by the arrow in FIG. 1 or FIG. 2) emitted via the display side 10-2 of the transparent display surface (the transparent region 10B can be considered as a transparent display surface of the display panel 10) from the transparent region 10B, thereby enlarging the viewing angle of the object or scene located behind the display screen 01.

Still referring to FIG. 1 or 2, in some embodiments of the present disclosure, a coverage area of each of the plurality of display side concave lenses 30 is greater than or equal to an area of a corresponding one of the plurality of transparent regions 10B. Thus the intensity of the light directed out by the display side concave lens 30 can be increased.

Here, the coverage area refers to an area of an orthographic projection of the display side concave lens 30 on the display panel 10.

In some embodiments, the display side concave lens 30 can also have various structures.

For example, referring to FIG. 1, each of the plurality of display side concave lenses 30 is a plano-concave lens, and under this circumstance, a concave surface 30a of the plano-concave lens is disposed away from the display panel 10 relative to a flat surface of the plano-concave lens. For example, an upper side of the display panel 10 illustrated in FIG. 1 is the display side 10-2 of the display panel 10; under the circumstances that the display side concave lens 30 is a plano-concave lens, the concave surface 30a of the plano-concave lens is located above the flat surface of the plano-concave lens.

Alternatively, referring to FIG. 2, each of the plurality of display side concave lenses 30 is a double-sided concave lens, i.e., one concave surface 30a of the double-sided concave lens is disposed close to the display panel 10, while another concave surface 30a is disposed away from the display panel 10.

In some embodiments, the backside concave lens 20 may be a plano-concave lens or a double-sided concave lens, and the display side concave lens 30 can also be a plano-concave lens or a double-sided concave lens. In actual application, the structure of the backside concave lens 20 and the structure of the display side concave lens 30 can be selected according to the actual requirement.

For example, referring to FIG. 1, each of the backside concave lenses 20 and each of the display side concave lenses 30 are plano-concave lenses; or referring to FIG. 2, each of the backside concave lenses 20 and each of the display side concave lenses 30 are double-sided concave lenses; or the backside concave lens 20 is a plano-concave lens, and the display side concave lens 30 is a double-sided concave lens; or the backside concave lens 20 is a double-sided concave lens, and the display side concave lens 30 is a plano-concave lens.

The display side concave lens 30 can be made of various materials.

Illustratively, the material of the display side concave lens 30 is an organic material easy to operate. For example, the material of the display side concave lens 30 may be epoxy resin, polymethyl methacrylate, polydimethylsiloxane, etc. The epoxy resin, polymethyl methacrylate, and polydimethylsiloxane all have the advantages such as optical transparency, low cost and easy duplication. The optical performance of the display side concave lens 30 can be improved and the difficulty in manufacturing the display side concave lens 30 can be reduced by selecting any of epoxy resin, polymethyl methacrylate, polydimethylsiloxane and so on as the material of the display side concave lens 30, so that the display side concave lens 30 can be manufactured using, e.g. a method of nanometer imprinting.

Polydimethylsiloxane is a more choice as a material of the display side concave lens 30. Polydimethylsiloxane is a high molecular organosilicon compound, having the advantages such as low coefficient of optical transparency attenuation, stable chemical structure, good mechanical properties, easy duplication, non-toxicity, biocompatibility and flexibility. The optical performance of the display side concave lens 30 can be further improved and the manufacturing difficulty and manufacturing cost of the display side concave lens 30 can be reduced by selecting polydimethylsiloxane as a material of the display side concave lens 30.

Still referring to FIG. 1 or 2, the display screen 01 provided in some embodiments of the present disclosure further comprises a transparent display side substrate film 80 disposed on the display side 10-2 of the display panel 10, the display side concave lens array 30' being formed on the transparent display side substrate film 80.

Here, the display side concave lens array being formed on the transparent display side substrate film 80 means forming single-sided or double-sided grooves on a position of the transparent display side substrate film 80 corresponding to the transparent region 10B of the display panel 10, thereby forming the display side concave lenses 30.

The above design enables the plurality of display side concave lenses 30 in the display side concave lens array 30' to be formed on the same transparent display side substrate film 80, which can facilitate the positioning of the display side concave lens and avoid offset between the display side concave lens 30 and the corresponding transparent region 10B.

In some embodiments of the present disclosure, a shape of the concave surface 20a of the backside concave lens 20 and a shape of the concave surface 30a of the display side concave lens 30 can be set according to the actual requirement. For example, both of the concave surface 20a of the backside concave lens 20 and the concave surface 30a of the display side concave lens 30 can be spherical surfaces. In this case, a radius of curvature of the concave surface 20a of the backside concave lens 20 and a radius of curvature of the concave surface 30a of the display side concave lens 30 can be set according to the actual requirement.

Illustratively, the radius of curvature of the concave surface 20a of the backside concave lens 20 is set greater than or equal to the radius of curvature of the concave surface 30a of the display side concave lens 30, such that the light reflected or emitted by the object located behind the display screen 01 is more directed to the transparent region 10B by the backside concave lens 20, thus increasing the intensity of the light reflected or emitted by the object located behind the display screen 01 that passes through the transparent region 10B. At the same time, the light that passes through the transparent region 10B is directed out via the display side concave lens 30, which enlarges the emission angle of the light emitted from the display side 10-2 of the display panel 10 after passing through the transparent region 10B, thereby enlarging the viewing angle of the object or scene located behind the display screen 01.

In some embodiments of the present disclosure, the display panel 10 is an OLED display panel.

Illustratively, still referring to FIG. 2, the display panel 10 comprises: a base substrate 11, a plurality of OLED components 15 disposed on the base substrate 11, and a plurality of transparent filling sections 19 disposed on the base substrate 11; each of the plurality of pixel display regions 10A is provided with at least one of the plurality of OLED components 15; each region of the base substrate 11 corresponding to one of the plurality of transparent regions 10B is provided with one of the plurality of transparent filling sections 19.

A region of the base substrate 11 corresponding to each of the pixel display regions 10A is provided with at least 3 sub-pixels, the above display panel 10 further comprises an encapsulation layer 18 for encapsulating the pixel display region 10A and the transparent region 10B; each of the sub-pixels comprises a thin film transistor 12 and an OLED component 15 sequentially formed on the base substrate 11, a passivation layer 13 (Passivation SiNx, PVX) and a planarization layer 14 are arranged between the thin film transistor 12 and the OLED component 15, and a pixel defining layer 16 is further arranged around each of the OLED components 15.

The number of sub-pixels in each of the pixel display regions 10A can be set according to a colour scheme of the display panel 10. For example, the number of sub-pixels in each of the pixel display regions 10A is three when the colour scheme of the display panel 10 is RGB (Red, Green, Blue), and the three sub-pixels are R sub-pixel, G sub-pixel, and B sub-pixel respectively; the number of sub-pixels in each of the pixel display regions 10A is four when the colour scheme of the display panel 10 is RGBW (Red, Green, Blue, White), and the four sub-pixels are R sub-pixel, G sub-pixel, B sub-pixel, and W sub-pixel respectively.

In some embodiments of the present disclosure, the description is made for the example that the colour scheme of the display panel is RGB (Red, Green, Blue). Referring to FIG. 1 or 2, the display panel 10 comprises: a base substrate 11, three sub-pixels located in each region of the base substrate 11 corresponding to one of the pixel display regions 10A, and an encapsulation layer 18 for encapsulating the pixel display regions 10A and the transparent regions 10B. The three sub-pixels are R sub-pixel marked as 10A1, G sub-pixel marked as 10A2, and B sub-pixel marked as 10A3. Each of the sub-pixels comprises a thin film transistor 12 and an OLED component 15 sequentially formed on the base substrate 11. The thin film transistor 12 may be any of an amorphous silicon thin film transistor, a monocrystalline silicon thin film transistor, a polysilicon thin film transistor, and a metal oxide thin film transistor. The structure of the thin film transistor 12 can also be selected according to the actual requirement; for example, the thin film transistor 12 may be a top-gate transistor thin film transistor or a bottom-gate thin film transistor.

In some embodiments of the present disclosure, the description is made for the example that the thin film transistor 12 is a metal oxide thin film transistor and the structure of the metal oxide thin film transistor is a bottom-gate thin film transistor. The thin film transistor 12 comprises: a gate 121, a gate insulating layer 122 (Gate Insulator, GI) covering the gate 121, an active layer 123 located on the gate insulating layer 122, and a source electrode 124 and a drain electrode 125 in contact with the active layer 123 respectively.

The display panel 10 further comprises a passivation layer 13 (Passivation SiNx, PVX) and a planarization layer 14 (Planarization, PLN) covering the thin film transistor 12 sequentially, the OLED component 15 is formed on the planarization layer 14. The OLED component 15 comprises an anode 151, an organic layer and a cathode 153 formed on the planarization layer 14 sequentially. The organic layer of the OLED component 15 in the R sub-pixel 10A1 is R organic layer 152A, which can emit red light. The organic layer of the OLED component 15 in the G sub-pixel 10A2 is G organic layer 152B, which can emit green light. The organic layer of the OLED component 15 in the B sub-pixel 10A3 is B organic layer 152C, which can emit blue light. The anode 151 of the OLED component 15 is connected to the drain electrode 125 of the thin film transistor 12. Each OLED component 15 is further surrounded by a pixel defining layer 16 (PDL) and a photoresistive spacer layer 17 (Photo Spacer, PS); the pixel defining layer 16 and the photoresistive spacer layer 17 both surround the organic layer of each OLED component 15.

In some embodiments, portions of the gate insulating layer 122, the passivation layer 13, the planarization layer 14, and the pixel defining layer 16 corresponding to the transparent region 10B respectively may or may not be removed.

When the portions of the gate insulating layer 122, the passivation layer 13, the planarization layer 14, and the pixel defining layer 16 corresponding to the transparent region 10B respectively are not removed, referring to FIG. 1, a region of the base substrate 11 corresponding to the transparent region 10B is sequentially laminated by, in a direction from the base substrate 11 to the encapsulation layer 18, a portion of the gate insulating layer 122 of the thin film transistor 12 located in the transparent region 10B, a portion of the passivation layer 13 located in the transparent region 10B, a portion of the planarization layer 14 located in the transparent region 10B, and a portion of the pixel defining layer 16 located in the transparent region 10B. That is, the gate insulating layer 122, the passivation layer 13, the planarization layer 14 and the pixel defining layer 16 are also formed within the transparent region 10B. Therefore, it is unnecessary to remove the portions of the gate insulating layer 122, the passivation layer 13, the planarization layer 14 and the pixel defining layer 16 corresponding to the transparent region 10B respectively when a display screen 01 is manufactured. This reduces the process steps for manufacturing the display screen 01.

In addition, corresponding portions of the gate insulating layer 122, the passivation layer 13, the planarization layer 14 and the pixel defining layer 16 are retained in the transparent region 10B, so that a region of the base substrate 11 corresponding to the transparent region 10B is not blank. The height difference between the structure in the pixel display region 10A and the structure in the transparent region 10B is small. This can avoid a poor encapsulation effect caused by a large height difference between the structure in the pixel display region 10A and the structure in the transparent region 10B when an encapsulation layer 18 is subsequently formed.

When the portions of the gate insulating layer 122, the passivation layer 13, the planarization layer 14, and the pixel defining layer 16 corresponding to the transparent region 10B respectively are removed, referring to FIG. 2, a transparent filling section 19 located in the transparent region 10B can be arranged between the base substrate 11 and the encapsulation layer 18, wherein the transparent filling section 19 may be a transparent resin filling section, i.e., a material of the transparent filling section 19 may be transparent resin.

Arranging a transparent filling section 19 located in the transparent region 10B between the base substrate 11 and the encapsulation layer 18 can reduce the height difference between the structure in the transparent region 10B and the structure in the pixel display region 10A on the base substrate 11. This can avoid a poor encapsulation effect caused by a large height difference between the structure in the pixel display region 10A and the structure in the transparent region 10B when an encapsulation layer 18 is subsequently formed.

Still referring to FIG. 1 or FIG. 2, the OLED component 15 comprises an anode 151, an organic layer, and a cathode 153 laminated sequentially on the planarization layer 14. The OLED components 15 of all sub-pixels in the display panel 10 share one cathode 153, i.e. the cathode 153 of all OLED components 15 is a whole layer of film connected together, and the whole layer of film covers all pixel display regions 10A and all transparent regions 10B. Thus, a transparent conductive film layer can be formed on the organic layer when the cathode 153 is manufactured, and the cathode 153 corresponding to each OLED component 15 can be formed without a need to etch the transparent conductive film layer, thereby reducing the process steps for manufacturing the display screen.

The cathode 153 is a transparent cathode, that is, the OLED component 15 is a top-emitting OLED component. Here the top-emitting OLED component means that the light emitted by the OLED exits from a side of the cathode 153.

In some embodiments of the present disclosure, the anode 151 may be made of a variety of materials. For example, the anode 151 is made of a metal material to improve a reflective effect of the anode 151 on the light emitted from the organic layer of the OLED component 15 and to increase a light-emitting intensity of the OLED component 15. Alternatively, the anode 151 comprises: two layers of indium tin oxide (ITO) and a reflective metal layer located between the two ITO layers. The ITO can increase a work function between the anode 151 and the cathode 153, thereby increasing the light-emitting intensity of the OLED component 15. Besides, the reflective metal layer can reflect the light emitted by the organic layer of the OLED component 15, thereby increasing the light-emitting intensity of the OLED component 15.

In some embodiments of the present disclosure, the cathode 153 may be made of a variety of materials. For example, the cathode 153 is made of a metal oxide conductive material, or the cathode 153 is made of a metal material, or the cathode 153 may be a composite cathode constituted by laminating a metal layer with an inorganic material layer. A thickness of the cathode 153 is greater than or equal to 10 nm and less than or equal to 20 nm when the cathode 153 is made of metal materials or when the cathode 153 is a composite cathode constituted by laminating a metal layer with an inorganic material layer, so as to avoid reducing transparency of the cathode 153 due to a too big thickness of the cathode 153 (e.g., greater than 20 nm), and avoid an uneven thickness of the cathode 153 and an increase of difficulty in manufacturing a cathode 153 due to a too small thickens of the cathode 153 (e.g. less than 10 nm).

In some embodiments, the plurality of pixel display regions 10A and the plurality of transparent regions 10B are arranged alternately. In practice, the plurality of pixel display regions 10A and the plurality of transparent regions 10B can be arranged in a variety of ways.

Figure 3:
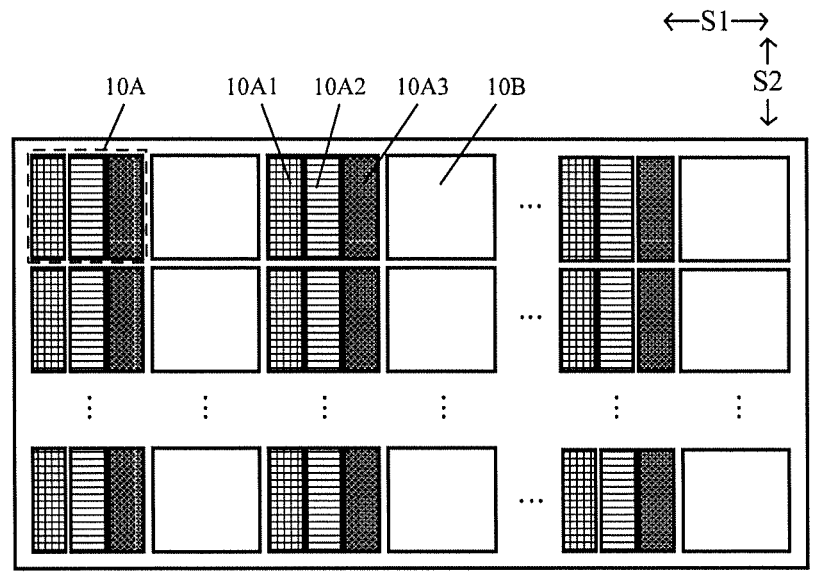
FIG. 3 is a schematic diagram of an arrangement of pixel display regions and transparent regions provided in some embodiments of the present disclosure.

Illustratively, referring to FIG. 3, at least one pixel display region 10A is arranged between two adjacent transparent regions 10B in a direction of row (marked as S1 in FIG. 3). For example, one pixel display region 10A is arranged between two adjacent transparent regions 10B in the direction of row. The transparent region 10B and the pixel display region 10A are not arranged alternatively in a direction of column (marked as S2 in FIG. 3), that is, the plurality of transparent regions 10B are arranged to form a plurality of columns of transparent regions 10B, and the plurality of pixel display regions 10A are arranged to form a plurality of columns of pixel display regions 10A. The plurality of columns of transparent regions 10B and the plurality of columns of pixel display regions 10A are arranged alternatively in a direction of row. That is, at least one column of pixel display regions 10A is arranged between two adjacent columns of transparent regions 10B. For example, one column of pixel display regions 10A is arranged between two adjacent columns of transparent regions 10B.

Figure 4:
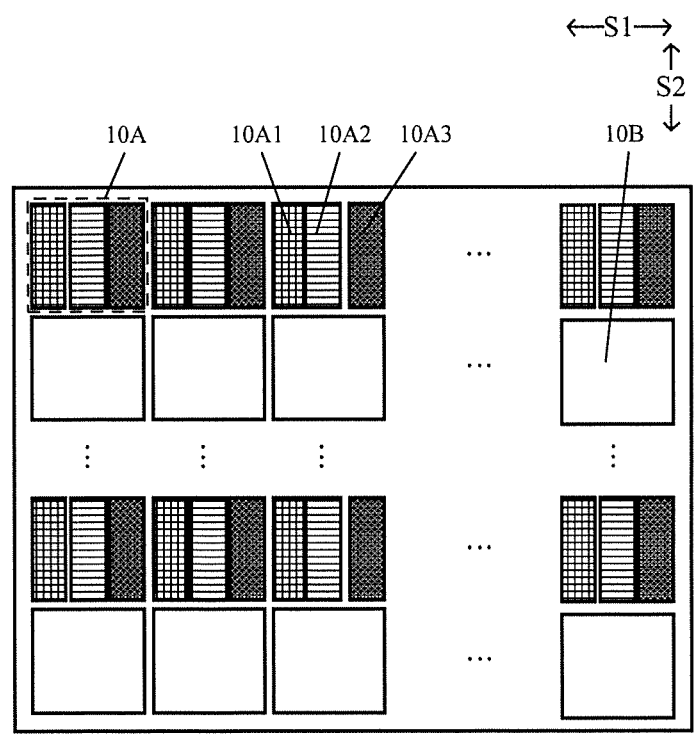
FIG. 4 is a schematic diagram of another arrangement of pixel display regions and transparent regions provided in some embodiments of the present disclosure.

Alternatively, referring to FIG. 4, at least one pixel display region 10A is arranged between two adjacent transparent regions 10B in a direction of column (marked as S2 in FIG. 4). For example, one pixel display region 10A is arranged between two adjacent transparent regions 10B in the direction of column. The transparent region 10B and the pixel display region 10A are not arranged alternatively in a direction of row (marked as S1 in FIG. 4), that is, the plurality of transparent regions 10B are arranged to form a plurality of rows of transparent regions 10B, and the plurality of pixel display regions 10A are arranged to form a plurality of rows of pixel display regions 10A. The plurality of rows of transparent regions 10B and the plurality of rows of pixel display regions 10A are arranged alternatively in a direction of column. That is, at least one row of pixel display regions 10A is arranged between two adjacent rows of transparent regions 10B. For example, one row of pixel display regions 10A is arranged between two adjacent rows of transparent regions 10B.

Figure 5:
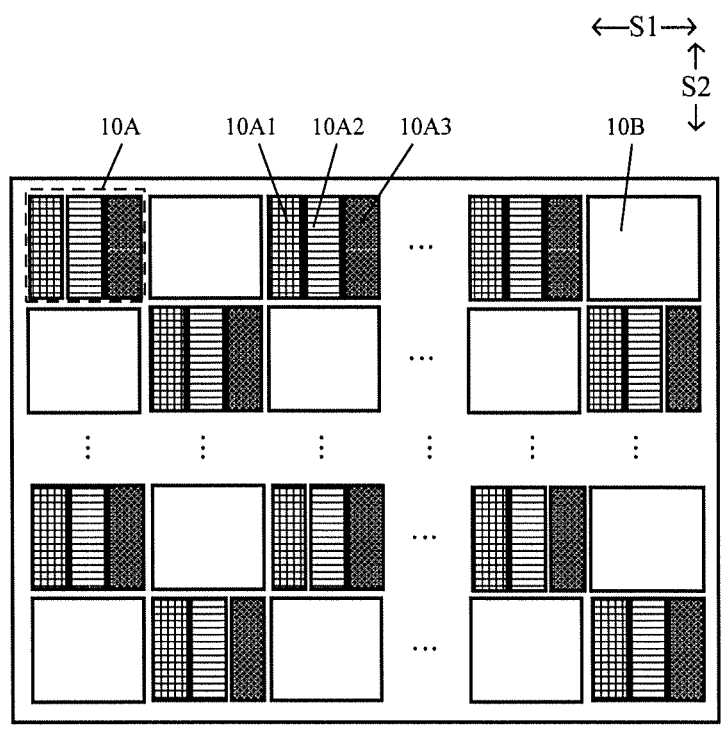
FIG. 5 is a schematic diagram of still another arrangement of pixel display regions and transparent regions provided in some embodiments of the present disclosure.

Alternatively, referring to FIG. 5, at least one pixel display region 10A is arranged between two adjacent transparent regions 10B in a direction of row (marked as S1 in FIG. 5), and at least one pixel display region 10A is also arranged between two adjacent transparent regions 10B in a direction of column (marked as S2 in FIG. 5). That is, the transparent region 10B and the pixel display region 10A are arranged alternatively in directions of both row and column. For example, still referring to FIG. 5, one pixel display region 10A is arranged between two adjacent transparent regions 10B in a direction of row, and one pixel display region 10A is arranged between two adjacent transparent regions 10B in a direction of column.

Continuing to refer to FIG. 1 or 2, in the display screen 01 provided in some embodiments of the present disclosure, the display screen 01 further comprises: a plano-convex lens array 40' disposed on a display side 10-2 of the display panel 10, the plano-convex lens array 40' comprising a plurality of plano-convex lenses 40, wherein each of the plurality of plano-convex lenses 40 is arranged in opposition to at least one sub-pixel in a corresponding one of the plurality of pixel display regions 10A, and a convex surface 40a of each of the plurality of plano-convex lenses 40 is disposed away from the display panel 10 relative to a flat surface of each of the plurality of plano-convex lenses 40.

Illustratively, the display side 10-2 of the display panel 10 is provided with plano-convex lenses 40 in one-to-one correspondence with the sub-pixels within the pixel display regions 10A, and the convex surface 40a of the plano-convex lens 40 is disposed away from the display panel 10 relative to the flat surface of the plano-convex lens 40.

In this way, after exiting from the display side 10-2 of the display panel 10 via the plano-convex lens 40, the light emitted by the OLED component 15 of the sub-pixel in the pixel display region 10A is enabled to be a basically parallel light. The light is incident onto the plano-convex lens 40 through the flat surface of the plano-convex lens 40, and then exits from the convex surface 40a of the plano-convex lens 40. Therefore, the plano-convex lens 40 can enlarge an emission angle of the light (as shown by the arrow in FIG. 1 or FIG. 2) emitted by the OLED component 15, thus enlarging a viewing angle of the picture displayed on the display screen 01. In addition, the plano-convex lens 40 can also reduce the phenomena of total reflection that occur when the light emitted by the OLED component 15 goes out from the display side 10-2 of the display panel 10, thus increasing the intensity of the light emitted by the OLED component 15 when it exits from the display side 10-2 of the display panel 10.

In some embodiments of the present disclosure, still referring to FIG. 1 or 2, the number of the plano-convex lenses 40 can be set according to the number of the pixel display regions 10A or the number of the sub-pixels. For example, there are a number of plano-convex lenses 40, and each of the plano-convex lenses 40 is opposite to a pixel display region 10A. In this case, each plano-convex lens 40 simultaneously modulates the light emitted by at least three sub-pixels in a corresponding pixel display region 10A;

Alternatively, there are a number of plano-convex lenses 40, and each of the plano-convex lenses 40 is disposed merely relative to one sub-pixel in a corresponding pixel display region 10A. That is, each sub-pixel is provided with a corresponding plano-convex lens 40. This can increase the intensity of the light emitted by the OLED component 15 in each sub-pixel exiting from the display side 10-2 of the display panel 10, thereby improving the display effect of the display panel 10.

When the display side 10-2 of the display panel 10 is provided with a plurality of display side concave lenses 30 and a plurality of plano-convex lenses 40, both of the plurality of display side concave lenses 30 and the plurality of plano-convex lenses 40 can be formed on a transparent display side substrate film, thus forming an overall structure to facilitate the manufacture and installation of the plurality of display side concave lenses 30 and the plurality of plano-convex lenses 40.

That is, a transparent display side substrate film is formed on the display side 10-2 of the display panel 10, and a single-sided or double-sided groove is formed on a portion of the transparent display side substrate film corresponding to the transparent region 10B, thereby forming display side concave lenses 30 corresponding to the transparent regions 10B. In addition, a convex surface is formed at a portion of the transparent display side substrate film corresponding to the pixel display region 10A, thereby forming a desired number of plano-convex lenses 40.

Figure 6:
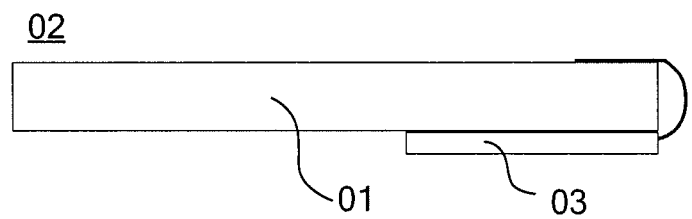
FIG. 6 is a schematic structural diagram of a display device provided in some embodiments of the present disclosure.

Some embodiments in the present disclosure further provide a display device 02. Referring to FIG. 6, the display device 02 comprises a display screen 01 as described above.

The display device has the same advantages as the above-mentioned display screen and will not be elaborated here.

The display device 02 may also include a circuit portion 03 that provides signals to the display screen 01, wherein the circuit portion 03 may illustratively include a compensator, a row driver, a column driver, etc. The compensator may illustratively include a sequence controller, a memory, a signal converter, etc.

The above structure is only an example, and other structures in the display device 02 other than the display screen 01 described above may follow the relevant design, and they are not limited in some embodiments of the present disclosure.

Figure 7:
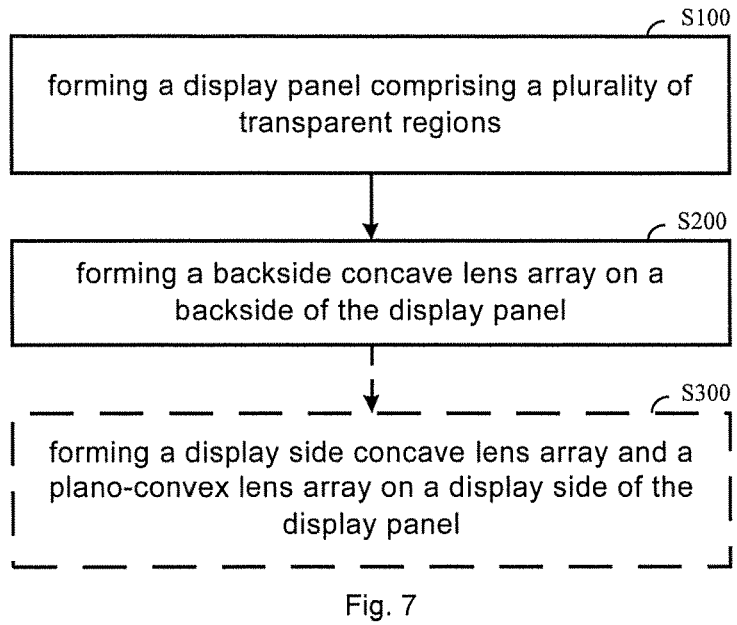
FIG. 7 is a flow chart of a method for manufacturing a display screen provided in some embodiments of the present disclosure.

Referring to FIG. 7, some embodiments in the present disclosure also provide a method for manufacturing a display screen 01, which is used to manufacture a display screen 01 as described above, the method for manufacturing a display screen 01 comprising steps 100-200 (S100-S00) below:

S100: forming a display panel comprising a plurality of transparent regions;

S200: forming a backside concave lens array on a backside of the display panel, wherein the backside concave lens array comprises a plurality of backside concave lenses, each of the plurality of backside concave lenses is corresponding to one of the plurality of transparent regions, each of the plurality of backside concave lenses comprises at least one concave surface, and one of the at least one concave surface is disposed away from the display panel.

The method for manufacturing a display screen has the same advantages as the above-mentioned display screen and will not be elaborated here.

Figure 8:
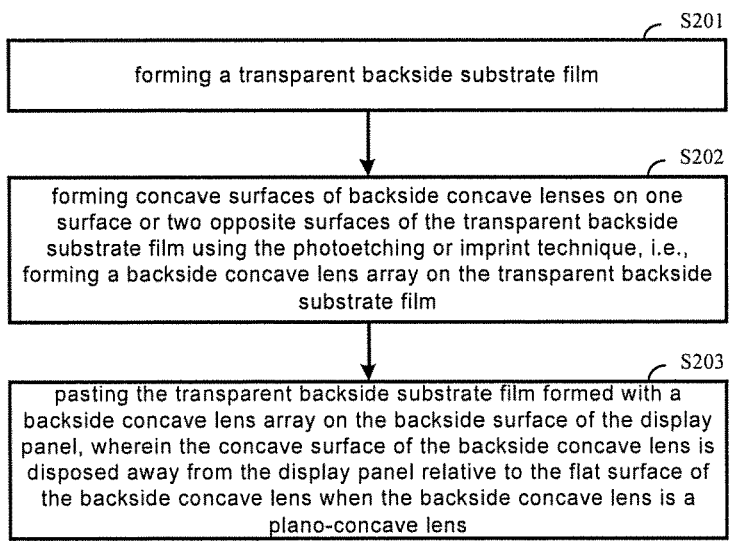
FIG. 8 is a flow chart of S200 in FIG. 7.

Referring to FIG. 8, S200 includes steps 201-203:

S201: Forming a transparent backside substrate film.

Illustratively, a transparent backside substrate film can be formed by extrusion, deposition, coating, etc. The transparent backside substrate film can be made of epoxy resin, polymethyl methacrylate, polydimethylsiloxane, etc., for example, polydimethylsiloxane.

S202: Forming concave surfaces of backside concave lenses on one surface or two opposite surfaces of the transparent backside substrate film using a photoetching or imprint technique, i.e., forming a backside concave lens array on the transparent backside substrate film.

In some embodiments, when a backside concave lens is a plano-concave lens, concave surfaces of plano-concave lenses are formed on one surface of the transparent backside substrate film using the photoetching or imprint technique, and concave surfaces of all plano-concave lenses on a backside of the display panel are formed on the transparent backside substrate film, so all plano-concave lenses are formed on the transparent backside substrate film. That is, all backside concave lenses are formed on the transparent backside substrate film to form a backside lens array film including a plurality of backside concave lenses arranged in an array. When a backside concave lens is a double-sided concave lens, two concave surfaces of a double-sided concave lens are formed on two opposite surfaces of the transparent backside substrate film using the photoetching or imprint technique. In this case, concave surfaces of all double-sided concave lenses on the backside of the display panel are formed on the transparent backside substrate film, so all double-sided concave lenses are formed on the transparent backside substrate film. That is, all backside concave lenses are formed on the transparent backside substrate film, so as to form a backside lens array film including a plurality of backside concave lenses arranged in an array.

Illustratively, when a photoetching technique is used to form a concave surface of a backside concave lens, a laser direct writing technique can be used to form a concave surface of the backside concave lens. When the laser direct writing technique is used to form a concave surface of the backside concave lens, it is determined whether to etch the transparent backside substrate film according to the material of the transparent backside substrate film.

Figure 11:
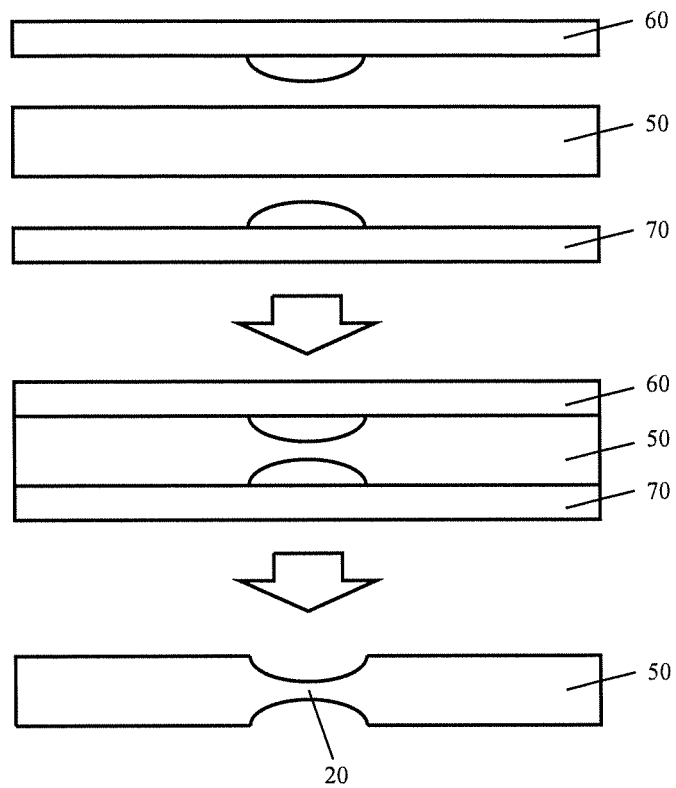
FIG. 11 is a flow chart of a process for forming a backside concave lens array by an imprint technique according to some embodiments of the present disclosure.

When an imprint technique is used to form a concave surface of a backside concave lens, a nanometer imprint technique can be used to form a concave surface of the backside concave lens. Referring to FIG. 11, the process of forming a concave surface of the backside concave lens using the nanometer imprint technique is described in detail by taking the backside concave lens being a double-sided concave lens as an example. This process includes steps (a)-(d):

S(a): preparing an upper imprint mold 60 and a lower imprint mold 70, the upper imprint mold 60 and the lower imprint mold 70 both having a structure complementary with the backside concave lens array to be formed;

S(b): placing the transparent backside substrate film 50 between the upper imprint mold 60 and the lower imprint mold 70, for example, placing the transparent backside substrate film 50 on the lower imprint mold 70, the upper imprint mold 60 being disposed in opposition to the lower imprint mold 70;

S(c): compressing the transparent backside substrate film 50 located between the upper imprint mold 60 and the lower imprint mold 70 using the upper imprint mold 60 and the lower imprint mold 70 disposed in opposition. For example, the upper imprint mold 60 is pressed toward the transparent backside substrate film 50, and the transparent backside substrate film 50 forms a structure of a backside concave lens under pressure of the upper imprint mold 60 and the lower imprint mold 70 (only one of the backside concave lenses 20 is shown in FIG. 11). In addition, the compressed transparent backside substrate film 50 can be cured by illumination or heating, such that the transparent backside substrate film 50 can be kept in a shape formed by compression from the upper imprint mold 60 and the lower imprint mold 70.

S(d): separating the upper imprint mold 60 and the lower imprint mold 70 from the transparent backside substrate film 50, i.e., performing a demoulding operation to form a backside concave lens array on the transparent backside substrate film 50.

S203: Pasting the transparent backside substrate film formed with a backside concave lens array on the backside surface of the display panel, wherein the concave surface of the backside concave lens is disposed away from the display panel relative to the flat surface of the backside concave lens when the backside concave lens is a plano-concave lens.

Illustratively, the transparent backside substrate film formed with a backside concave lens array is pasted onto the backside surface of the display panel after the steps of forming a backside concave lens array on the transparent backside substrate film are completed, wherein backside concave lenses in the backside concave lens array are disposed relative to corresponding transparent regions.

Here, when the backside concave lenses are plano-concave lenses, a concave surface of a plano-concave lens is disposed away from the display panel relative to a flat surface of the plano-concave lens.

Here, when a backside concave lens array is formed on the backside of the display panel using the steps S201, S202, and S203, it is available that a backside concave lens array including a plurality of backside concave lenses arranged in an array is firstly formed on the transparent backside substrate film, and then the transparent backside substrate film formed with the backside concave lens array is pasted onto a backside of the display panel.

Figure 9:
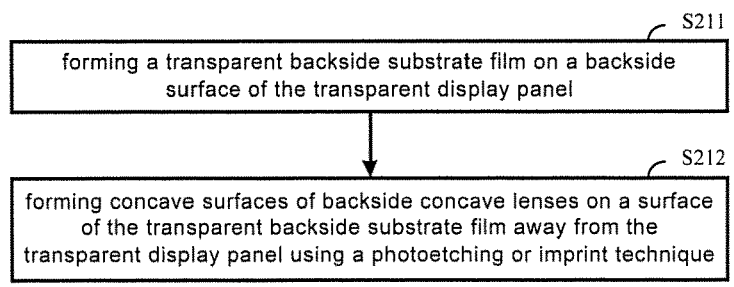
FIG. 9 is another flow chart of S200 in FIG. 7.

In actual use, it is also available that a backside concave lens array including a plurality of backside concave lenses arranged in an array is directly formed on a backside surface of the display panel. Illustratively, when the backside concave lens is a plano-concave lens, reference can be made to FIG. 9. S200 includes steps 211-212.

S211: forming a transparent backside substrate film on a backside surface of the display panel. For example, a transparent backside substrate film can be formed on a backside surface of the display panel by coating, plasma enhanced chemical vapor deposition (PECVD), etc.

S212: forming concave surfaces of backside concave lenses on a surface of the transparent backside substrate film away from the display panel using a photoetching or imprint technique, i.e., forming a backside concave lens array on the transparent backside substrate film. The photoetching technique may be a laser direct writing technique, and the imprint technique may be a nanometer imprint technique.

Figure 10A:
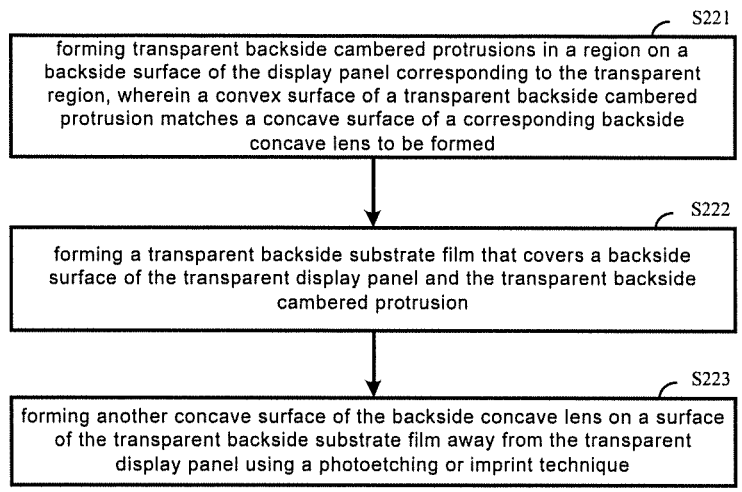
FIG. 10A is still another flow chart of S200 in FIG. 7.

When the backside concave lens is a double-sided concave lens, reference can be made to FIG. 10A. S200 includes steps 221-223.

Figure 10B:
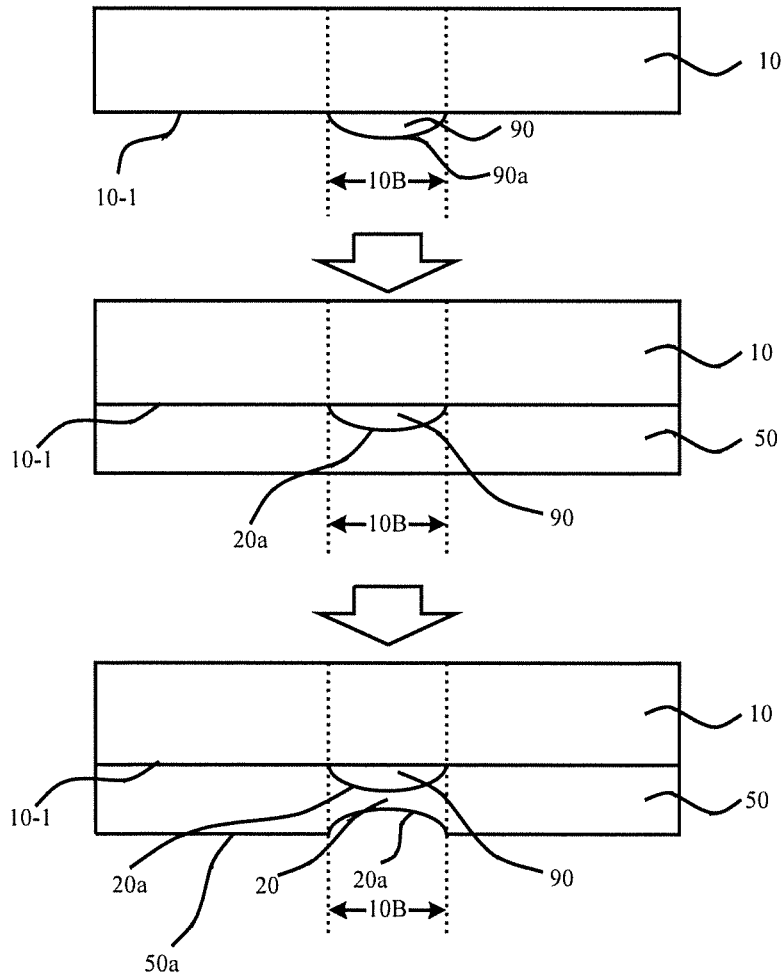
FIG. 10B is a schematic structural diagram of S200 in FIG. 10A.

S221: referring to FIG. 10B, forming transparent backside cambered protrusions 90 (only one is shown in FIG. 10B) in a region on a backside 10-1 surface of the display panel 10 corresponding to the transparent region 10B, wherein a convex surface 90a of a transparent backside cambered protrusion 90 matches a concave surface of a corresponding backside concave lens to be formed.

Illustratively, it is available that a transparent film is firstly formed on the backside surface of the display panel, and then a transparent backside cambered protrusion is formed using the photoetching or imprint technique.

S222: still referring to FIG. 10B, forming a transparent backside substrate film 50 that covers a backside 10-1 surface of the display panel 10 and the transparent backside cambered protrusion 90.

Illustratively, a transparent backside substrate film 50 can be formed on the backside 10-1 surface of the display panel 10 by coating, plasma enhanced chemical vapor deposition (PECVD), etc. The transparent backside substrate film 50 covers the backside 10-1 surface of the display panel 10 and the transparent backside cambered protrusion 90. On a surface of the transparent backside substrate film 50 that close to the display panel 10, a portion that is in contact with the transparent backside cambered protrusion 90 is presented as a concave surface, i.e., it is used as a concave surface 20a of a backside concave lens to be formed that faces the display panel 10.

S223: still referring to FIG. 10B, forming another concave surface 20a of the backside concave lens on a surface 50a of the transparent backside substrate film 50 away from the display panel 10 using a photoetching or imprint technique. A concave surface formed on a surface 50a of the transparent backside substrate film 50 away from the display panel 10 together with the part, which is on a surface of the transparent backside substrate film 50 close to the display panel 10, contacting the transparent backside cambered protrusion 90 constitute the backside concave lens 20, so as to form a backside concave lens array on the transparent backside substrate film 50. The photoetching technique may be a laser direct writing technique, and the imprint technique may be a nanometer imprint technique.

Here, each of the formed backside concave lenses 20 is a double-sided concave lens, and the transparent backside cambered protrusion 90 is retained between a concave surface 20a of the backside concave lens 20 close to the display panel 10 and the display panel 10, without a need to be removed.

The above formed display panel further comprises a plurality of pixel display regions; the plurality of pixel display regions and the plurality of transparent regions are both arranged in an array, and the plurality of pixel display regions and the plurality of transparent regions are arranged alternatively (referring to the above description for the manner of alternative arrangement, which will not be elaborated here), and each of the plurality of pixel display regions is provided with at least one sub-pixel.

Continuing to refer to FIG. 7, the method for manufacturing a display screen further includes a step 300 (S300) after S100.

S300: forming a display side concave lens array and a plano-convex lens array on a display side of the display panel, wherein the display side concave lens array comprises a plurality of display side concave lenses, each of the plurality of display side concave lenses is corresponding to each of the plurality of transparent regions, each of the plurality of display side concave lenses comprises at least one concave surface, and one of the at least one concave surface is disposed away from the display panel; the plano-convex lens array comprises a plurality of plano-convex lenses, each of the plurality of plano-convex lenses is disposed relative to at least one sub-pixel in a corresponding one of the plurality of pixel display regions, and a convex surface of each of the plurality of plano-convex lenses is disposed away from the display panel relative to a flat surface of each of the plurality of plano-convex lenses.

Figure 12:
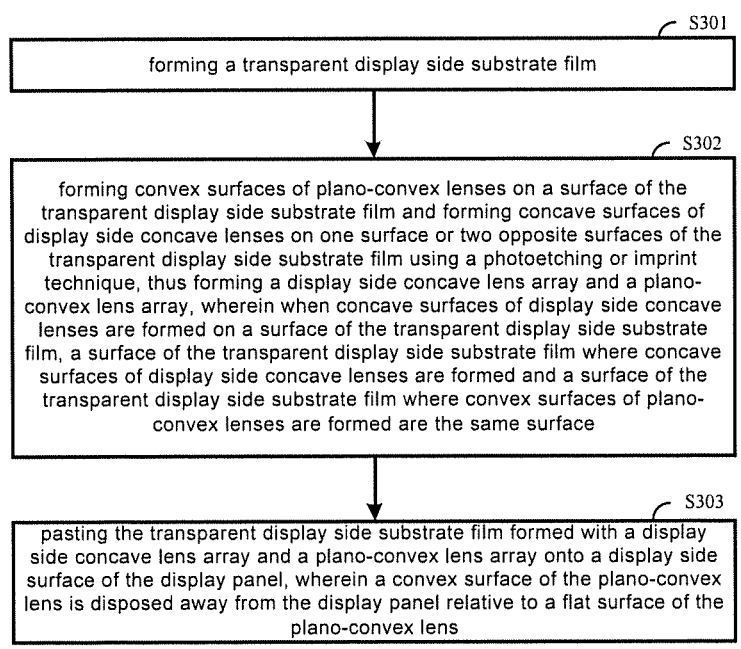
FIG. 12 is a flow chart of S300 in FIG. 7.

Illustratively, S300 can be implemented in many ways. For example, referring to FIG. 12, S300 includes steps 301-303:

S301: forming a transparent display side substrate film.

S301 can be implemented similarly to S201, which will not be elaborated here.

S302: forming convex surfaces of plano-convex lenses on a surface of the transparent display side substrate film and forming concave surfaces of display side concave lenses on one surface or two opposite surfaces of the transparent display side substrate film using a photoetching or imprint technique, thus forming a display side concave lens array and a plano-convex lens array, wherein when concave surfaces of display side concave lenses are formed on a surface of the transparent display side substrate film, a surface of the transparent display side substrate film where concave surfaces of display side concave lenses are formed and a surface of the transparent display side substrate film where convex surfaces of plano-convex lenses are formed are the same surface.

S302 can be implemented similarly to S202, which will not be elaborated here.

S303: pasting the transparent display side substrate film formed with a display side concave lens array and a plano-convex lens array onto a display side surface of the display panel, wherein a convex surface of the plano-convex lens is disposed away from the display panel relative to a flat surface of the plano-convex lens.

Figure 13:
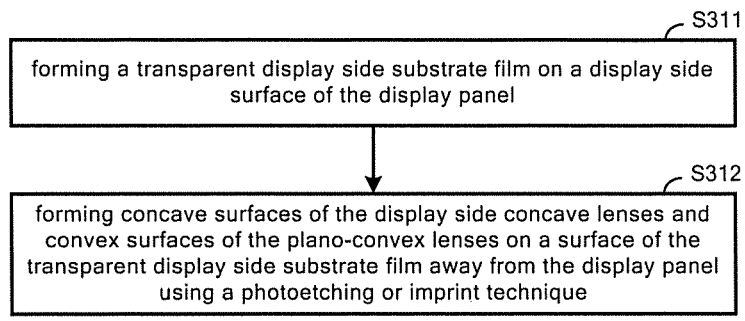
FIG. 13 is another flow chart of S300 in FIG. 7.

Alternatively, referring to FIG. 13, S300 includes steps 311-312 (S311-S312):

S311: forming a transparent display side substrate film on a display side surface of the display panel.

S312: forming concave surfaces of the display side concave lenses and convex surfaces of the plano-convex lenses on a surface of the transparent display side substrate film away from the display panel using a photoetching or imprint technique, i.e., forming a display side concave lens array and a plano-convex lens array on the transparent display side substrate film.

Figure 14:
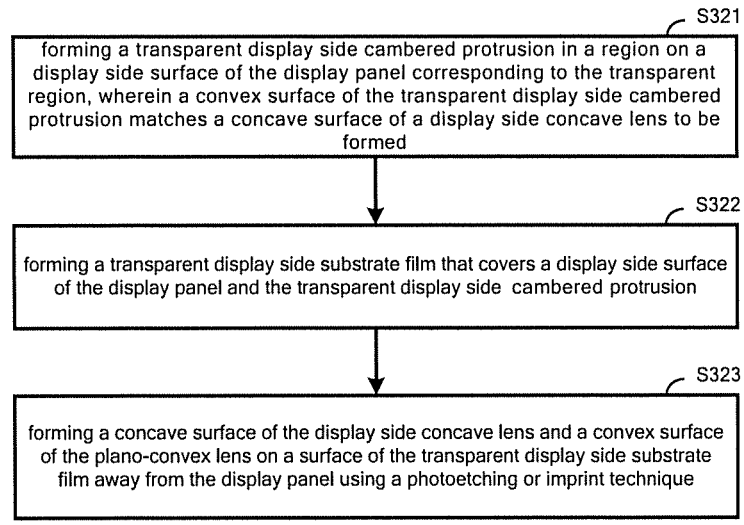
FIG. 14 is still another flow chart of S300 in FIG. 7.

Still alternatively, referring to FIG. 14, S300 includes steps 321-323 (S321-S323):

S321: forming a transparent display side cambered protrusion in a region on a display side surface of the display panel corresponding to the transparent region, wherein a convex surface of the transparent display side cambered protrusion matches a concave surface of a display side concave lens to be formed.

S322: forming a transparent display side substrate film that covers a display side surface of the display panel and the transparent display side cambered protrusion.

S323: forming another concave surface of the display side concave lens and a convex surface of the plano-convex lens on a surface of the transparent display side substrate film away from the display panel using a photoetching or imprint technique, i.e., forming a display side concave lens array and a plano-convex lens array on the transparent display side substrate film.

Thus, the display side concave lens formed is a double-sided concave lens, and for the operation procedure reference can be made to the above FIG. 10B, which will not be elaborated here.

Figure 15:
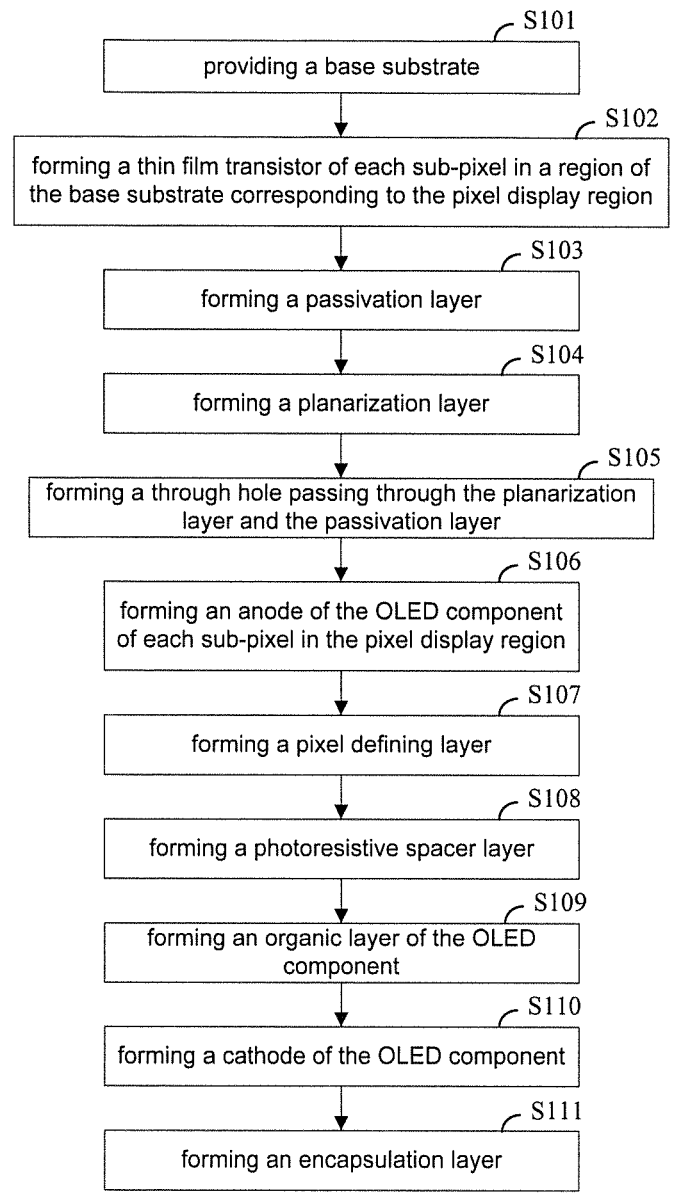
FIG. 15 is a flow chart of S100 in FIG. 7.

In the above embodiment, the process to be performed in S100 can be determined according to the actual structure of the display panel. For example, referring to FIG. 15, S100 includes steps 101-111 (S101-S111) when the portions of the gate insulating layer, the passivation layer, the planarization layer, and the pixel defining layer in the regions corresponding to the transparent region respectively are not removed.

S101: providing a base substrate.

S102: forming a thin film transistor of each sub-pixel in a region of the base substrate corresponding to the pixel display region. A gate of the thin film transistor is located on the base substrate, a gate insulating layer of the thin film transistor covers the gate and the base substrate, and an active layer of the thin film transistor is located on the gate insulating layer. A source electrode and a drain electrode of the thin film transistor are in contact with the active layer respectively.

S103: forming a passivation layer. The passivation layer covers the source electrode, the drain electrode, the active layer and the gate insulating layer.

S104: forming a planarization layer. The planarization layer covers the passivation layer.

S105: forming a through hole passing through the planarization layer and the passivation layer. The through hole exposes the drain electrode of the thin film transistor.

S106: forming an anode of the OLED component of each sub-pixel in the pixel display region. The anode is connected to the drain electrode of the corresponding thin film transistor via the through hole formed in the above S105.

S107: forming a pixel defining layer. The pixel defining layer is located around the OLED component, and covers a region of the planarization layer corresponding to the transparent region.

S108: forming a photoresistive spacer layer. The photoresistive spacer layer is located on the pixel defining layer, and is disposed around the OLED component.

S109: forming an organic layer of the OLED component.

S110: forming a cathode of the OLED component. The cathode covers the organic layer, the photoresistive spacer layer, and the pixel defining layer. That is, the cathode of all OLED components is a whole layer of film connected together.

S111: forming an encapsulation layer. The encapsulation layer covers the cathode and the base substrate.

Figure 16:
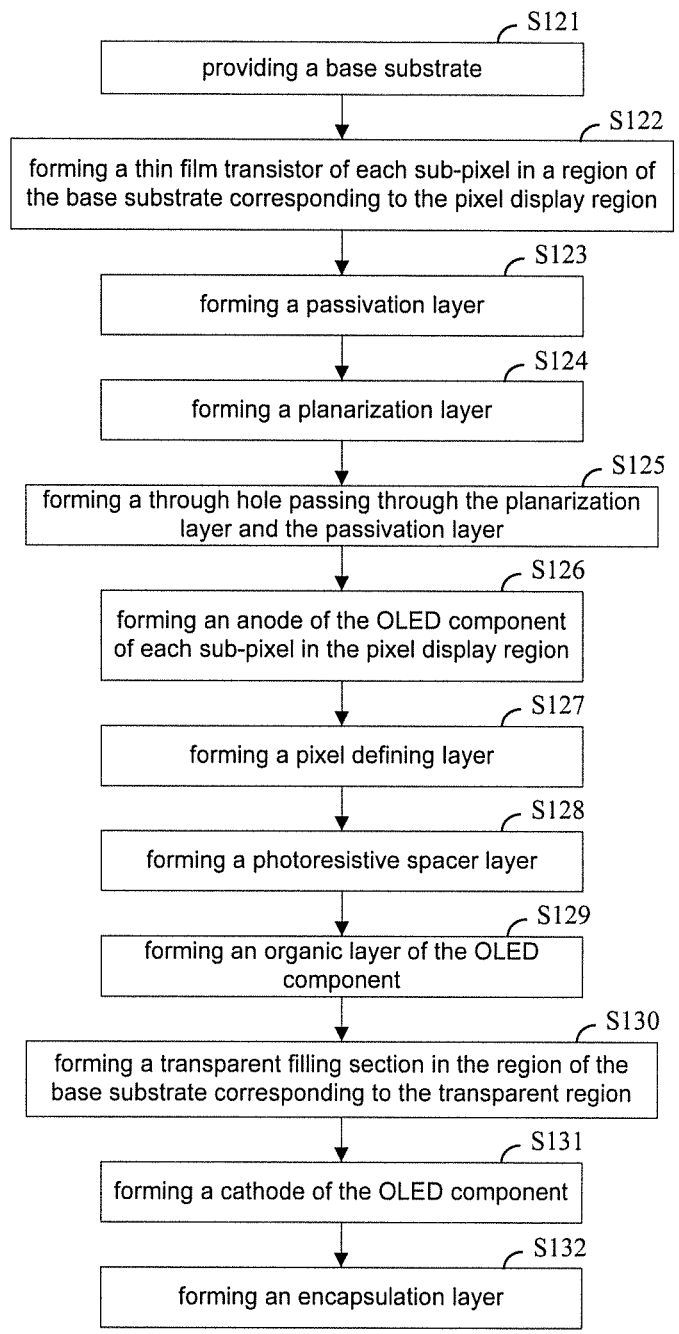
FIG. 16 is another flow chart of S100 in FIG. 7.

Alternatively, referring to FIG. 16, S100 includes steps 121-132 (S121-S132) when all portions of the gate insulating layer, the passivation layer, the planarization layer, and the pixel defining layer in the regions corresponding to the transparent region respectively are removed and a transparent filling section is formed in the transparent region.

S121: providing a base substrate.

S122. forming a thin film transistor of each sub-pixel in a region of the base substrate corresponding to the pixel display region. A gate of the thin film transistor is located on the base substrate, a gate insulating layer of the thin film transistor covers the gate and all regions of the base substrate except the region corresponding to the transparent region, and an active layer of the thin film transistor is located on the gate insulating layer. A source electrode and a drain electrode of the thin film transistor are in contact with the active layer respectively.

S123: forming a passivation layer. The passivation layer does not cover the region of the base substrate corresponding to the transparent region.

S124: forming a planarization layer. The planarization layer covers the passivation layer and does not cover the region of the base substrate corresponding to the transparent region.

S125: forming a through hole passing through the planarization layer and the passivation layer. The through hole exposes the drain electrode of the thin film transistor.

S126: forming an anode of the OLED component of each sub-pixel in the pixel display region. The anode is connected to the drain electrode of the corresponding thin film transistor via the through hole formed in the above S125.

S127: forming a pixel defining layer. The pixel defining layer is located around the OLED component, and does not cover the region of the base substrate corresponding to the transparent region.

S128: forming a photoresistive spacer layer. The photoresistive spacer layer is located on the pixel defining layer.

S129: forming an organic layer of the OLED component.

S130: forming a transparent filling section in the region of the base substrate corresponding to the transparent region.

S131: forming a cathode of the OLED component. The cathode covers the organic layer, the photoresistive spacer layer, and the transparent filling section. That is, the cathode of all OLED components is a whole layer of film connected together.

S132: forming an encapsulation layer. The encapsulation layer covers the cathode and the base substrate.

In the description of the above embodiments, specific features, structures, materials or characteristics can be combined in an appropriate manner in any one or more embodiments or samples.

The above embodiments are merely specific embodiments of the present disclosure, but the protection scope of the present disclosure is not limited thereto. Any person skilled in the art could readily conceive of changes or replacement within the technical scope of the present disclosure, which should all be included in the protection scope of the present disclosure. Therefore, the protection scope of the present disclosure should be determined by the protection scope of the claims.

What is claimed is:

1. A display screen, comprising:
a display panel, a backside concave lens array located on a backside of the display panel, wherein
the backside is a side of the display panel away from a display side; the display panel comprises a plurality of transparent regions; the backside concave lens array comprises a plurality of backside concave lenses, and each of the plurality of backside concave lenses is corresponding to a corresponding one of the plurality of transparent regions; each of the plurality of backside concave lenses comprises at least one concave surface, and one of the at least one concave surface is disposed away from the display panel.

2. The display screen according to claim 1, wherein the display panel further comprises a plurality of pixel display regions, wherein
the plurality of pixel display regions and the plurality of transparent regions are both arranged in an array, and the plurality of pixel display regions and the plurality of transparent regions are arranged alternatively;
each of the plurality of backside concave lenses is in one-to-one correspondence with each of the plurality of transparent regions.

3. The display screen according to claim 2, wherein an area covered by each of the plurality of backside concave lenses is greater than or equal to an area of a corresponding one of the plurality of transparent regions.

4. The display screen according to claim 2, wherein
each of the plurality of backside concave lenses is a double-sided concave lens;
or
each of the plurality of backside concave lenses is a plano-concave lens, and a concave surface of the plano-concave lens is disposed away from the display panel relative to a flat surface of the plano-concave lens.

5. The display screen according to claim 2, wherein each of the plurality of backside concave lenses is made of epoxy resin, polymethyl methacrylate or polydimethylsiloxane.

6. The display screen according to claim 2, wherein the display screen further comprises a transparent backside substrate film disposed on the backside of the display panel, and the backside concave lens array is formed on the transparent backside substrate film.

7. The display screen according to claim 2, wherein the display screen further comprises a display side concave lens array located at a display side of the display panel, wherein
the display side concave lens array comprises a plurality of display side concave lenses, each of the plurality of display side concave lenses is in one-to-one correspondence with each of the plurality of transparent regions; each of the plurality of display side concave lenses comprises at least one concave surface, and one of the at least one concave surface is disposed away from the display panel.

8. The display screen according to claim 7, wherein a coverage area of each of the plurality of display side concave lenses is greater than or equal to an area of a corresponding one of the plurality of transparent regions.

9. The display screen according to claim 7, wherein
each of the plurality of display side concave lenses is a double-sided concave lens;
or
each of the plurality of display side concave lenses is a plano-concave lens, and a concave surface of the plano-concave lens is disposed away from the display panel relative to a flat surface of the plano-concave lens.

10. The display screen according to claim 7, wherein each of the plurality of display side concave lenses is made of epoxy resin, polymethyl methacrylate, or polydimethylsiloxane.

11. The display screen according to claim 7, wherein the display screen further comprises a transparent display side substrate film disposed on a display side of the display panel, and the display side concave lens array is formed on the transparent display side substrate film.

12. The display screen according to claim 7, wherein a radius of curvature of a concave surface of each of the plurality of backside concave lenses is greater than or equal to a radius of curvature of a concave surface of each of the plurality of display side concave lenses.

13. The display screen according to claim 2, wherein the display panel is an OLED panel comprising:
 a base substrate;
 a plurality of OLED components disposed on the base substrate;
 a plurality of transparent filling sections disposed on the base substrate, wherein
 each of the plurality of pixel display regions is provided with at least one of the plurality of OLED components;
 a region of the base substrate corresponding to each of the plurality of transparent regions is provided with one of the plurality of transparent filling sections.

14. The display screen according to claim 13, wherein each of the plurality of transparent filling sections is made of transparent resin.

15. The display screen according to claim 2, wherein the display screen further comprises:
 a plano-convex lens array disposed on a display side of the display panel;
 at least one sub-pixel disposed in each of the plurality of pixel display regions; wherein
 the plano-convex lens array comprises a plurality of plano-convex lenses, each of plurality of plano-convex lenses is disposed opposite to the at least one sub-pixel in a corresponding one of the plurality of pixel display regions, and a convex surface of each of the plurality of plano-convex lenses is disposed away from the display panel relative to a flat surface of each of the plurality of plano-convex lenses.

16. The display screen according to claim 15, wherein each of the plurality of plano-convex lenses is disposed opposite to each of the at least one sub-pixel in a corresponding pixel display region.

17. A display device comprising the display screen according to claim 1.

18. A method for manufacturing a display screen according to claim 1, comprising:
 forming a display panel comprising a plurality of transparent regions;
 forming a backside concave lens array on a backside of the display panel, wherein the backside concave lens array comprises a plurality of backside concave lenses, each of the plurality of backside concave lenses is corresponding to one of the plurality of transparent regions, each of the plurality of backside concave lenses comprises at least one concave surface, and one of the at least one concave surface is disposed away from the display panel.

19. The method for manufacturing a display screen according to claim 18, wherein the display panel further comprises a plurality of pixel display regions; the plurality of pixel display regions and the plurality of transparent regions are both arranged in an array, the plurality of pixel display regions and the plurality of transparent regions are arranged alternatively, and each of the plurality of pixel display regions is provided with at least one sub-pixel;
 the method for manufacturing a display screen further comprises:
 forming a display side concave lens array and a plano-convex lens array on a display side of the display panel, wherein the display side concave lens array comprises a plurality of display side concave lenses, each of the plurality of display side concave lenses is in one-to-one correspondence with each of the plurality of transparent regions, each of the plurality of display side concave lenses comprises at least one concave surface, and one of the at least one concave surface is disposed away from the display panel; the plano-convex lens array comprises a plurality of plano-convex lenses, each of the plurality of plano-convex lenses is disposed opposite to the at least one sub-pixel in a corresponding one of the plurality of pixel display regions, and a convex surface of each of the plurality of plano-convex lenses is disposed away from the display panel relative to a flat surface of each of the plurality of plano-convex lenses.

20. The method for manufacturing a display screen according to claim 18, wherein
 forming a backside concave lens array on a backside of the display panel comprises:
 forming a transparent backside substrate film;
 forming a backside concave lens array on the transparent backside substrate film using a photoetching or imprint technique, wherein the photoetching technique is a laser direct writing technique, and the imprint technique is a nanometer imprint technique;
 forming a display side concave lens array and a plano-convex lens array on a display side of the display panel comprises:
 forming a transparent display side substrate film;
 forming a display side concave lens array and a plano-convex lens array on the transparent display side substrate film using a photoetching or imprint technique, wherein the photoetching technique is a laser direct writing technique, and the imprint technique is a nanometer imprint technique.

\* \* \* \* \*